United States Patent [19]
Mase et al.

[11] Patent Number: 4,613,888
[45] Date of Patent: Sep. 23, 1986

[54] SEMICONDUCTOR DEVICE OF MULTILAYER WIRING STRUCTURE

[75] Inventors: Yasukazu Mase, Tokyo; Masahiro Abe, Yokohama; Masaharu Aoyama, Fujisawa; Takashi Ajima, Kamakura, all of Japan

[73] Assignee: Kabushiki Kaisha Toshiba, Kawasaki, Japan

[21] Appl. No.: 634,030

[22] Filed: Jul. 24, 1984

[30] Foreign Application Priority Data

Jul. 28, 1983 [JP] Japan ............................... 58-138312

[51] Int. Cl.⁴ ..................... H01L 21/44; H01L 21/47; H01L 21/94
[52] U.S. Cl. ........................................ 357/54; 357/52; 357/71
[58] Field of Search ............................. 357/54, 71, 52

[56] References Cited

U.S. PATENT DOCUMENTS

| | | | |
|---|---|---|---|
| 4,040,083 | 8/1977 | Saiki et al. | 357/54 |
| 4,123,565 | 10/1978 | Sumitomo et al. | 357/54 |
| 4,396,934 | 8/1983 | Nishida | 357/52 |

OTHER PUBLICATIONS

Mukai et al, IEEE J. of S.S.C., vol. SC-13, No. 4, Aug. 1978, "Planar Multilevel., Polyimide", pp. 462–467.

Primary Examiner—Martin H. Edlow
Assistant Examiner—Jerome Jackson, Jr.
Attorney, Agent, or Firm—Finnegan, Henderson, Farabow, Garrett & Dunner

[57] ABSTRACT

A semiconductor device is disclosed which includes a multilayer formed of a hard inorganic main insulation film and a soft subinsulation film as insulation interlayers, and a hard inorganic insulation film as a final passivation film. The final passivation film is directly deposited on the hard inorganic main insulation film of the multilayer.

16 Claims, 10 Drawing Figures

SEMICONDUCTOR DEVICE OF MULTILAYER WIRING STRUCTURE

BACKGROUND OF THE INVENTION

The present invention relates to a semiconductor device of a multilayer wiring structure and, more particularly, to an improvement in a multilayer wiring structure.

A semiconductor device of a multilayer wiring structure in which a multilayer comprising two insulation films is used as an insulating interlayer and a polyimide-based resin film is used as a final passivation film is conventionally known.

An example of a semiconductor device having such a two-layer wiring structure as a multilayer wiring structure (i.e., having two metal wiring layers) and a manufacturing process thereof will be described with reference to FIGS. 1 to 3.

Referring to FIG. 1, a first metal wiring layer 13 formed of an aluminum-silicon alloy has a predetermined pattern and is formed on a semiconductor substrate (e.g., silicon substrate) 11 through a first insulation film 12, such as an $SiO_2$ film. Then, a silicon nitride film 14, to be a main insulating interlayer of a multilayer insulation film, is formed to have a thickness of about 0.8 $\mu$m on the resultant substrate by a plasma chemical vapour deposition method within a temperature range that the first metal wiring layer 13 can withstand. In this case, a portion of the silicon nitride film 14 formed on the edge of the first metal wiring layer 13 has a recessed portion having a steep step A. An $SiO_2$-based resin film consisting of, e.g., "OCD ®" (where ® means a trade name) is deposited on the silicon nitride film 14, and thereafter a silica film 15 of a thickness of about 0.6 $\mu$m, to be a subinsulating interlayer of the multilayer insulation film, is formed. Then, the silica film 15 is heat-treated to be hardened. This silica film (insulation film) 15 is formed to moderate the steep step A of the silicon nitride film 14 serving as the main insulating interlayer. Therefore, when a liquid material is deposited on the silicon nitride film 14, it fills a portion having the steep step A of the film 14 and so the step is moderated.

Referring to FIG. 2, the multilayer insulation film consisting of the silicon nitride film 14 and the silica film 15 is patterned by a conventional photolithography method (e.g., reactive ion etching (RIE)), and a contact hole 101 or the like is formed. A photoresist film (not shown) for patterning is removed by plasma etching using $O_2$ gas.

Referring to FIG. 3, a second metal wiring layer 16 consisting of pure aluminum is formed on the resultant substrate. Thereafter, a polyimide-based resin solution is spin-coated and is then heat-treated to be hardened. As a result, a polyimide-based resin film 17 as a final passivation film is formed to a thickness of about 2.0 $\mu$m. Then, the polyimide-based resin film 17 is patterned by a conventional photolithography method using a hydrazine hydrate-based etching solution such that an opening (not shown) for forming a bonding pad is formed. A photoresist film (not shown) for patterning is removed by, for example, an organic photoresist solution and then the final heat-treatment is performed.

In this manner, a conventional semiconductor device of a two-layer wiring structure is formed.

However, the conventional semiconductor device described above has the following problems.

The silicon nitride film as the main insulating interlayer of a multilayer insulation film is formed by a plasma CVD method at a relatively low temperature, such that a first metal wiring layer mainly consisting of aluminum and underlying the multilayer insulation film is not damaged. In this case, a portion of the silicon nitride film 14, which is formed on the edge of the underlying metal wiring layer 13, has a steep step indicated by the reference symbol "A" in FIG. 1. If the second metal wiring layer 16 is directly formed on this silicon nitride film 14 having the steep step A, there is a possibility that step coverage will be poor in a portion of the second metal wiring layer 16 formed on the step A. Therefore, the silica solution is deposited to moderate the slope of the step A as described above. In other words, the silica solution fills a portion having the step and so the step is moderated. The silica solution forms the silica film 15 as the subinsulating interlayer. Then, the second metal wiring layer 16 is formed on this subinsulating interlayer, thereby preventing poor step coverage thereof.

In a multilayer wiring structure having such a subinsulating interlayer, a polyimide-based resin film is formed as the final passivation film 17 as described above. However, it is preferable that an inorganic hard insulating substance such as $Si_3N_4$, which has good humidity resistance, impurity blocking properties and resistance to damage, is used as a final passivation film. However, such an insulating substance cannot be used in the conventional device described above. The silica film 15 formed as the subinsulating interlayer is soft in comparison with an inorganic insulation film, such as an $Si_3N_4$ film, and has poor adhesion with respect to the inorganic insulation film, such as the $Si_3N_4$ film. For this reason, if the hard inorganic insulation film, such as the $Si_3N_4$ film, is formed on the soft silica film 15, the inorganic insulation film tends to be shifted slightly. As a result, cracks are formed in the inorganic insulation film by a stress acting thereon. In particular, when a semiconductor chip having such a configuration is encapusulated by resin molding, high stress, caused by a variation in temperature in a molding resin, acts on a passivation film and cracks are formed.

For the same reason, when such a conventional semiconductor device has three or more metal wiring layers, an inorganic hard insulation film cannot be used as an insulating interlayer except as a first insulating interlayer. If the hard inorganic insulation film is used in addition to the first insulating interlayer, the hard inorganic insulation film is shifted for the same reason described above, and cracks are formed therein. Furthermore, when the conventional semiconductor device described above undergoes cracking in the inorganic insulation film, satisfactory insulation for the metal wiring layer formed thereon cannot be provided.

SUMMARY OF THE INVENTION

The present invention has been made in consideration of the above situation and has as its object to provide a semiconductor device having a passivation film and an insulating interlayer, which comprise hard inorganic insulation films having good humidity resistance, corrosion resistance, alkali ion blocking properties and mechanical strength.

According to the invention, there is provided a semiconductor device of a multilayer wiring structure characterized by comprising:

a semiconductor substrate;

a first inorganic insulation film having a predetermined pattern and formed on said semiconductor substrate;
an insulation film having a predetermined pattern and formed on said first inorganic insulation film;
a wiring layer formed on said insulation film; and
a second inorganic insulation film which is hard and formed to cover a major surface of a structure, a portion of said insulation film not covered by said wiring layer being selectively etched, and said second inorganic insulation film being in direct contact with said first inorganic insulation film where said insulation film is etched.

DETAILED DESCRIPTION OF THE PREFERRED EMBODIMENTS

An embodiment of a semiconductor device according to the present invention and a manufacturing process thereof will now be described with reference to the accompanying drawings. In this embodiment, the present invention is applied to a semiconductor device of a two-layer structure having two metal layers.

Figure 1:
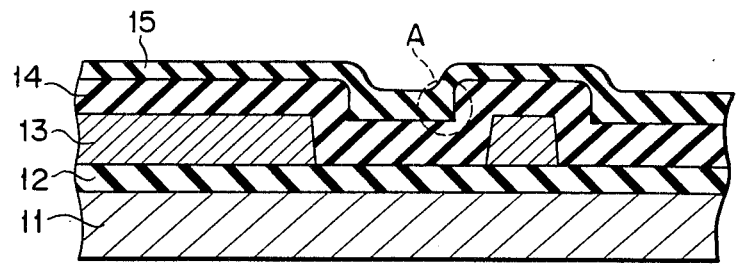
FIGS. 1 to 3 are views showing a semiconductor device of a two-layer wiring structure and a manufacturing process thereof.
Figure 2:
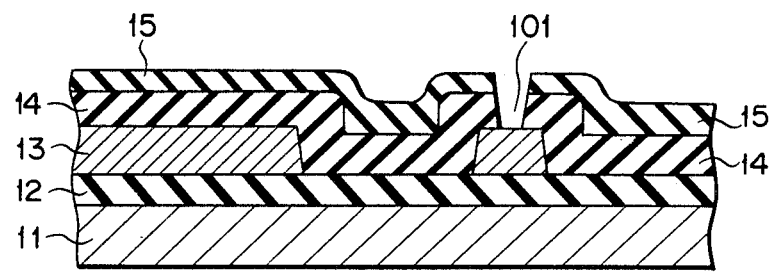
Figure 3:
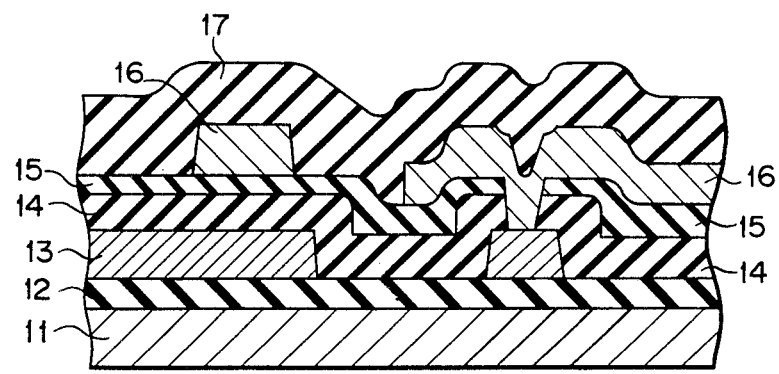
Figure 4:
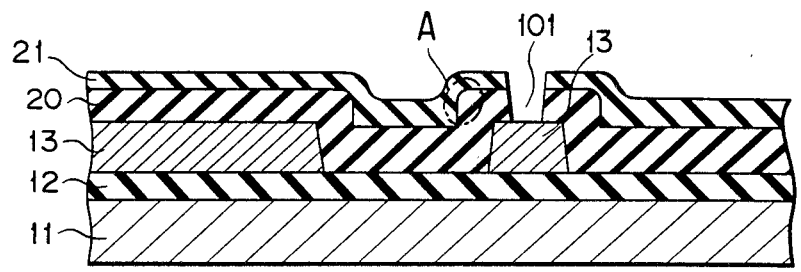
FIGS. 4 to 7 are views showing a semiconductor device of a two-layer wiring structure and a manufacturing process thereof according to one embodiment of the present invention.

Referring to FIG. 4, an insulation film (e.g., $SiO_2$ film) 12 having a predetermined pattern is formed on a major surface of a semiconductor substrate 11 consisting of silicon, for example. Then, a first metal wiring layer 13 having a predetermined pattern and a thickness of about 1.0 $\mu$m is formed by a conventional method on the resultant substrate. A silicon nitride film 20, to be a main insulating interlayer with a thickness of about 0.8 $\mu$m, is formed by a plasma CVD method (e.g., at a gas flow rate of $SiH_4/NH_3 = 60/30$ SCCM (standard cc/minute), a carrier gas of Ar of 7,000 SCCM, a pressure of 87 Pa (Pascal), a temperature of 320° C. and an RF (radio frequency) power of 320 mA). In this case, a portion of the silicon nitride film 20 corresponding to an edge of the first wiring layer 13 is formed to have a recessed portion having a steep step A. A silica film solution is spin-coated on the silicon nitride film 20. Subsequently, drying (e.g., at a temperature of 100° C. for 30 minutes), heating for vitrification (e.g., at a temperature of 300° C. for 40 minutes), and baking (e.g., at a temperature of 400° C. for 40 minutes) are sequentially performed to form a silica film as a subinsulating interlayer 21 with a thickness of about 0.6 $\mu$m. In this case, a silica solution as the material of the insulating interlayer 21 is in a liquid form during the spin-coating, so that it fills the recessed portion of the silicon nitride film 20 to moderate the steep step A. Thus, the entire surface of the silicon nitride film 20 is substantially flattened. Note that an organic resin such as a polyimide-based resin can be used as the material of the insulating interlayer 21 instead of an inorganic insulation resin such as silica solution. Then, an opening 101 is formed in the main and subinsulating interlayers 20 and 21 by a conventional photolithography method (e.g., at a gas flow rate of $H_2/CF_4 = 10/40$ SCCM, an RF power of 400 W, a pressure of 1.3 Pa, and an etching rate of a silica film to a plasma $Si_3N_4$ film of 1:1). Thereafter, a photoresist film (not shown), used as a mask in the above photolithography, is removed by plasma etching using $O_2$ gas at an $O_2$ pressure of 130 Pa and an RF power of 350 W. Subsequently, the surface of the silica film 21 is roughened by, for example, a diluted 0.5% hydrofluoric acid solution.

Figure 5:
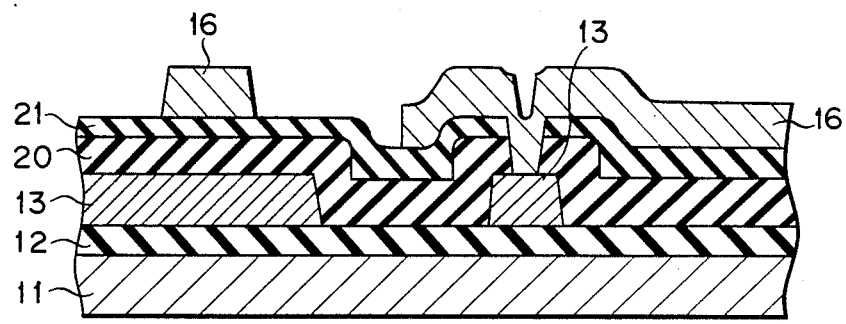

As shown in FIG. 5, a pure aluminum film is formed on the resultant substrate shown in FIG. 4 by using an electron-beam heating-deposition apparatus (e.g., at an initial vacuum pressure of $2.66 \times 10^{-4}$ Pa, a vaccum pressure during deposition of $6.00 \times 10^{-3}$ Pa, and a deposition rate of 200 Å/min). A photoresist film (not shown) having a predetermined pattern is formed on the pure aluminum film. Then, patterning of the pure aluminum film is performed by using the photoresist film as a mask and using an aluminum etching solution having a mixing ratio of, for example, $H_3PO_4:CH_3COOH:HNO_2:H_2O = 50:10:2:3$. Thereafter, the photoresist film used as a mask is removed by an organic etching solution, and a second metal wiring layer 16 having a predetermined pattern is formed.

Figure 6:
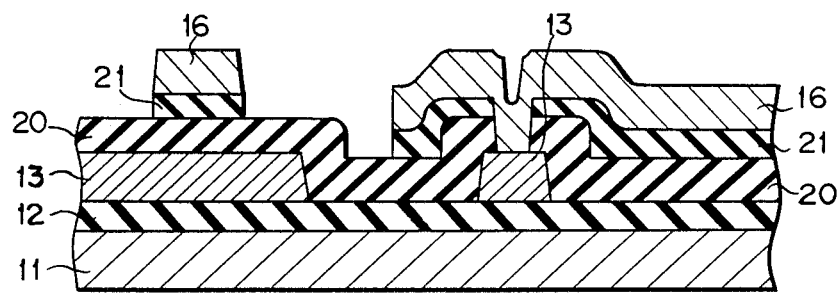

Next, as shown in FIG. 6, an exposed portion of the silica film 21, not covered by the second metal wiring layer 16, is removed by using the second metal wiring layer 16 as a mask in an RIE method (e.g., at a gas flow rate of $H_2/CF_4 = 16/22$ SCCM, an RF power of 500 W, a pressure of 1.3 Pa, and an etching rate of a silica film to a plasma $Si_3N_4$ film of 9:1).

Figure 7:
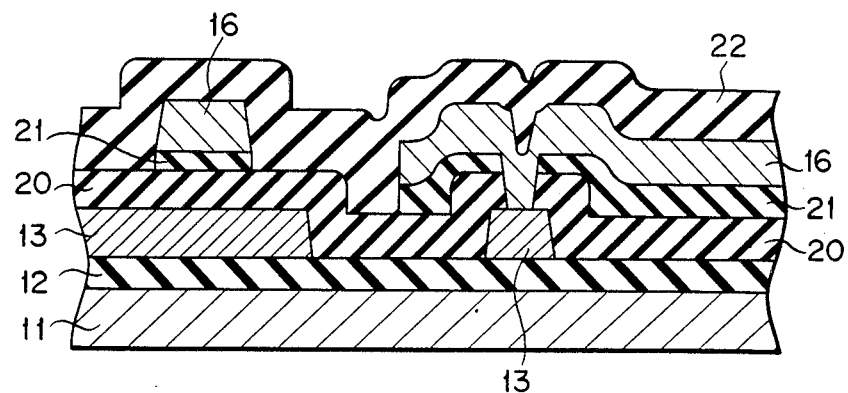

Referring to FIG. 7, a silicon nitride film 22 with a thickness of about 1.0 $\mu$m is formed as a final passivation film on the resultant structure of FIG. 6 by a plasma CVD method (e.g., at a gas flow rate of $SiH_4/NH_3 = 60/300$ SCCM, a flow rate of Ar as a carrier gas of 700 SCCM, a pressure of 87 Pa, a temperature of 320° C., and an RF power of 320 W). Thereafter, an opening (not shown) for forming a bonding pad is formed in the final passivation film 22 by conventional photolithography using a CVD method (e.g., at a gas flow rate of $CF_4/O_2 = 400/150$ SCCM, a microwave output of 330 W, and a pressure of 43 Pa).

In the process described above, a semiconductor device of two-layer wiring structure according to the embodiment of the present invention is provided.

In the embodiment described above, a semiconductor device of a two-layer wiring structure is represented. Furthermore, in this embodiment, an upper, that is, second metal wiring layer is covered by a final passivation film. However, the present invention can also be applied to a semiconductor device of a multilayer metal wiring structure having three or more metal wiring layers. In this case, an inorganic film to be a main insulating interlayer and an insulation film to be a subinsulating interlayer are sequentially formed to constitute a first multilayer insulation film on a substrate through a first metal wiring layer in the same manner as the above embodiment. Then, the main and subinsulating interlayers are patterned to form an opening in a predetermined position. Thereafter, a second metal wiring layer is formed thereon. Subsequently, the subinsulating interlayer is selectively etched by using the second metal wiring layer as a mask. Then, in the same manner of formation as that of the first insulating interlayer, an inorganic film to be a second main insulating interlayer and an insulation film to be a second insulating interlayer are sequentially formed on the resultant structure to constitute a second multilayer insulation film. Thereafter, a third metal wiring layer having a predetermined pattern is formed on the second multilayer insulation film. Then, the second multilayer insulation film is selectively etched using the third metal wiring layer as a mask.

A semiconductor device of the present invention has the following effects.

In a semiconductor device having two metal wiring layers, a hard inorganic insulation film can be used as a final passivation film. In a semiconductor device having three or more metal wiring layers, it can be used as any insulating interlayer except a first insulating interlayer and as a final passivation film. The reason why such a hard inorganic insulation film can be used is that the mutilayer insulation film or the final passivation film is directly deposited on an underlying hard inorganic film, such as a silicon nitride film, without going through a soft inorganic resin film, such as a silica film, or a soft organic resin film, such as a polyimide-based resin film. In such a structure, even if a molding resin is changed in its properties corresponding to changes in ambient temperature, for example, the multilayer insulation film or the final passivation film is not shifted. Therefore, these layers do not cause cracking. This can be found with reference to a graph (FIG. 8) representing a total cracking rate of a conventional semiconductor device and a semiconductor device of the present invention obtained from a temperature cycle test (TCT). Note that a semiconductor device of a two-layer wiring structure was used in the test of both a conventional device and a device of the present invention.

Figure 8:
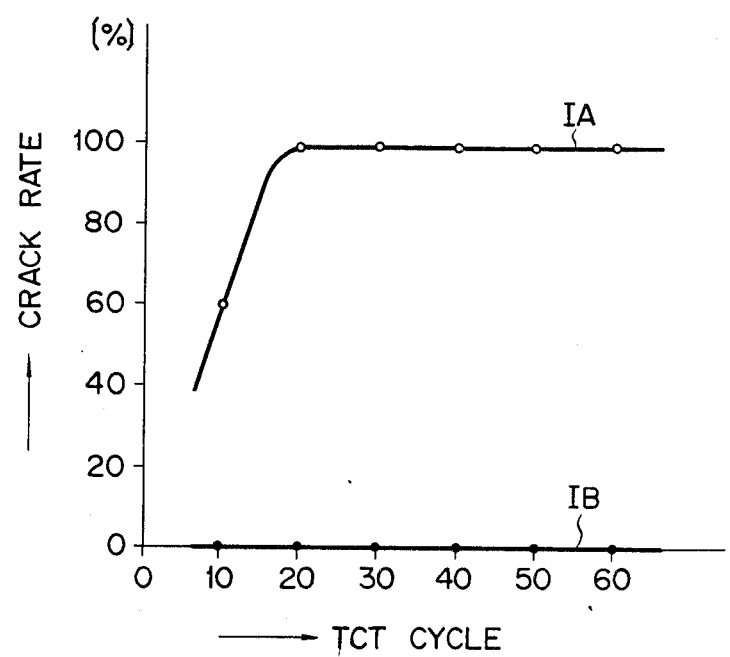
FIG. 8 is a graph showing results of a temperature cycle test (TCT) for a semiconductor device of the present invention and a conventional semiconductor device.

In FIG. 8, a curve denoted by reference symbol IA represents characteristics of a semiconductor device formed by resin-molding a pellet having a conventional multilayer wiring structure by using a phenolic resin (MP 3000×2 ®). The pellet includes a silicon nitride film and a silica film as main and subinsulating interlayers of a multilayer insulation film, respectively, and a silicon nitride film with a thickness of 1.0 µm as a final passivation film. A curve denoted by reference symbol IB represents characteristics of a semiconductor device formed by resin-molding a pellet by the phenolic resin (MP 3000×2 ®) as in the case of the conventional device. The pellet included a silicon nitride film of a thickness of about 1.0 µm as the final passivation film 22 in the above embodiment. As is apparent from comparison of the curves IA and IB, a large difference in the total cracking rate between the characteristics of the two devices can be found. In other words, although the TCT cycle was repeated 60 times for the device of the present invention, substantially no cracks were formed regardless of the number of times of the TCT cycle. On the contrary, in the conventional device, cracks were formed in proportion to the number of times of the TCT cycle. Accordingly, when the TCT cycle was repeated 20 times, cracks were formed in all the tested devices (i.e., the passivation films of all the tested devices), as apparent from the curve IA. Therefore, it is found that the semiconductor device of the present invention has significantly better characteristics with regard to the total cracking rate compared to the conventional device.

Figure 9:
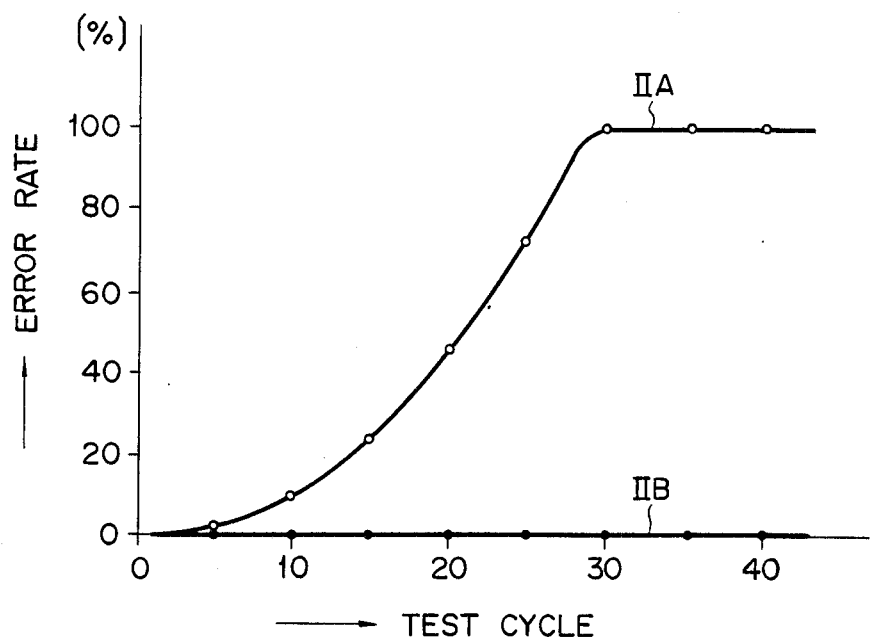
FIG. 9 is a graph showing results of a pressure cooker test (PCT) and a bias temperature test (BT) for a semiconductor device of the present invention and a conventional semiconductor device.

FIG. 9 shows a graph representing characteristics of the total error rate obtained from a reliability test. A conventional pellet having a polyimide-based resin film with a thickness of about 2.0 µm as a final passivation film is molded by a phenolic resin (MP 3000×2 ®) to obtain a semiconductor device, and a pellet of the above embodiment having a silicon nitride film with a thickness of about 1.0 µm as a final passivation film is molded by a phenoic resin (MP 3000×2 ®) to obtain a semiconductor device. In the reliability test for these semiconductor devices, a pressure cooker test (PCT) in steam at 2.5 atm for 20 hours and a bias temperature test (BT) at a temperature of 85° C. and a voltage of −15 V for 20 hours were performed as one test cycle. In FIG. 9, a curve denoted by reference symbol IIA represents characteristics of the conventional device, and a curve denoted by reference symbol IIB represents characteristics of the device of the present invention.

As is apparent from the comparison of the curves IIA and IIB of FIG. 9, it is found that the increase in the total error rate corresponded to the increase in the number of repetitions of the test cycle in the conventional device having the polyimide-based resin film as the passivation film. When the test cycle was repeated about 30 times, all the tested devices became defective. On the other hand, in the device of the present invention having the silicon nitride film as the final passivation film, no error was found until at least 40 repetitions of the test cycle. Therefore, it is found that the device of the present invention had significantly better reliability.

Figure 10:
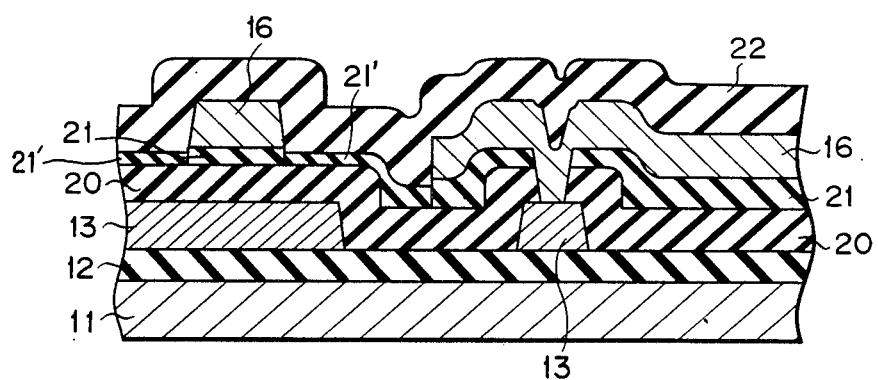
FIG. 10 is a view showing a semiconductor device according to another embodiment of the present invention.

FIG. 10 shows another embodiment of a semiconductor device of the present invention. In this embodiment, a portion of a subinsulating interlayer 21 not covered by a second metal wiring layer 16 is not completely removed, and a damaged surface layer formed both before and during the deposition of the second metal wiring layer 16 is removed. Since a semiconductor device of this embodiment has the same structure as a semiconductor device of the embodiment described above except in this feature, the same reference numerals are used for the same parts and therefore a description thereof is omitted. A damaged layer is formed in the surface of the subinsulating interlayer 21 both before and during deposition of the second metal wiring layer, whereby a current leak through this damaged portion occurs in the operation mode. This current leakage can be reduced by removing the damaged surface layer. Then, operation can be satisfactorily performed. The removal of the damaged surface layer can be performed by etching in the same manner as that of the portion of the subinsulating interlayer 21 of the embodiment described above. Note that, in this embodiment, etching is performed for removing only the damaged surface layer, not the entire portion of the subinsulating interlayer 21. Therefore, moderate etching conditions are used and only a short etching time is needed. In this embodiment, a leakage current is significantly reduced.

In this manner, according to the present invention, a final passivation film is directly deposited on a hard main insulating interlayer without going through a soft subinsulating interlayer, so that a hard inorganic insulation film such as a silicon nitride film can be used as a final passivation film. Therefore, a semiconductor device of the present invention has good environmental resistance such as humidity resistance, alkali ion blocking properties, and corrosion resistance in comparison to a conventional device. A semiconductor device of the present invention also has good resistance to damage and high mechanical strength, which are important factors in the assembly process. Furthermore, from the viewpoint of manufacturing, a semiconductor device of the present invention can be obtained using a conventional manufacturing process with merely the addition of an etching process of an insulation film which uses a metal wiring layer as a mask thereof. Accordingly, the manufacturing process will not become complex.

The present invention is not limited to the embodiments described above. For example, in the above embodiments, although an aluminum-silicon alloy film or a pure aluminum film is used as a wiring layer, a metal film consisting of mainly silicon or the like can be used in place of the aluminum-based metal film. A passivation film and a main insulating interlayer are not limited to a silicon nitride film, but an inorganic and hard material consisting of mainly silicon oxide, for example, can be used instead.

What is claimed is:

1. A semiconductor device of a multilayer wiring structure comprising:
    a semiconductor substrate;
    a first insulation film having a predetermined pattern formed on said semiconductor substrate;
    a first wiring layer having a predetermined pattern formed on said first insulation film;
    a second insulation film having a predetermined pattern formed on said first insulation film;
    a third insulation film having a predetermined pattern formed on said second insulation film, said second and third insulation films having a first continuous contact hole;
    a second wiring layer formed on said third insulation film to fully cover said third insulation film, said second wiring layer extending into said first contact hole and contacting said first wiring layer; and
    a fourth insulation film formed on an entire major surface of the structure and contacting said second insulation film.

2. A semiconductor device of a multilayer wiring structure according to claim 1, wherein said first wiring layer is a metal layer.

3. A semiconductor device of a multilayer wiring structure according to claim 1, wherein said second wiring layer is a metal layer.

4. A semiconductor device of a multilayer wiring structure according to claim 1, wherein said fourth insulation film is a final passivation film.

5. A semiconductor device of a multilayer wiring structure according to claim 1, wherein said second insulation film is an interlayer.

6. A semiconductor device of a multilayer wiring structure according to claim 1, wherein said third insulation film is an interlayer.

7. A semiconductor device of a multilayer wiring structure according to claim 1, wherein said third insulation film is an inorganic resin film.

8. A semiconductor device of a multilayer wiring structure according to claim 1, wherein said fourth insulation film is an inorganic resin film.

9. A semiconductor device of a multilayer wiring structure comprising:
    a semiconductor substrate;
    a first insulation film having a predetermined pattern formed on said semiconductor substrate;
    a first wiring layer having a predetermined pattern formed on said first insulation film;
    a second insulation film having a predetermined pattern formed on said first insulation film;
    a third insulation film having a predetermined pattern formed on said second insulation film, said third insulation film having a section from which a damaged portion has been removed and said second and third insulation films having a first continuous contact hole;
    a second wiring layer formed on said third insulation film, except at said section, to fully cover said third insulation film except at said section, said second wiring layer extending into said first contact hole and contacting said first wiring layer; and
    a fourth insulation film formed on an entire major surface of the structure and contacting said section of said third insulation film.

10. A semiconductor device of a multilayer wiring structure according to claim 9, wherein said first wiring layer is a metal layer.

11. A semiconductor device of a multilayer wiring structure according to claim 9, wherein said second wiring layer is a metal layer.

12. A semiconductor device of a multilayer wiring structure according to claim 9, wherein said fourth insulation film is a final passivation film.

13. A semiconductor device of a multilayer wiring structure according to claim 9, wherein said second insulation film is an interlayer.

14. A semiconductor device of a multilayer wiring structure according to claim 9, wherein said third insulation film is an interlayer.

15. A semiconductor device of a multilayer wiring structure according to claim 9, wherein said third insulation film is an inorganic resin film.

16. A semiconductor device of a multilayer wiring structure according to claim 9, wherein said fourth insulation film is an inorganic resin film.

* * * * *